United States Patent
Bossen et al.

(10) Patent No.: US 6,851,071 B2
(45) Date of Patent: Feb. 1, 2005

(54) APPARATUS AND METHOD OF REPAIRING A PROCESSOR ARRAY FOR A FAILURE DETECTED AT RUNTIME

(75) Inventors: Douglas Craig Bossen, Austin, TX (US); Daniel James Henderson, Georgetown, TX (US); Raymond Leslie Hicks, Rochester, MN (US); Alongkorn Kitamorn, Austin, TX (US); David Otto Lewis, Rochester, MN (US); Thomas Alan Liebsch, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 679 days.

(21) Appl. No.: 09/974,967

(22) Filed: Oct. 11, 2001

(65) Prior Publication Data

US 2003/0074598 A1 Apr. 17, 2003

(51) Int. Cl.[7] .................................................. G06F 11/00
(52) U.S. Cl. ........................ 714/5; 714/7; 714/8; 714/9; 714/10
(58) Field of Search .............................. 714/5, 7, 8, 9, 714/10

(56) References Cited

U.S. PATENT DOCUMENTS

| | | | | |
|---|---|---|---|---|
| 5,535,411 A | * | 7/1996 | Speed et al. .................... | 713/2 |
| 6,189,117 B1 | * | 2/2001 | Batchelor et al. .............. | 714/48 |
| 6,615,375 B1 | * | 9/2003 | Mounes-Toussi et al. ..... | 714/54 |
| 6,782,492 B1 | * | 8/2004 | Nakaso ........................ | 714/42 |

* cited by examiner

*Primary Examiner*—Robert Beausoliel
*Assistant Examiner*—Michael C Maskulinski
(74) *Attorney, Agent, or Firm*—Duke W. Yee; Mark E. McBurney; Stephen J. Walder, Jr.

(57) ABSTRACT

An apparatus and method of repairing a processor array for a failure detected at runtime in a system supporting persistent component deallocation are provided. The apparatus and method of the present invention allow redundant array bits to be used for recoverable faults detected in arrays during run time, instead of only at system boot, while still maintaining the dynamic and persistent processor deallocation features of the computing system. With the apparatus and method of the present invention, a failure of a cache array is detected and a determination is made as to whether a repairable failure threshold is exceeded during runtime. If this threshold is exceeded, a determination is made as to whether cache array redundancy may be applied to correct the failure, i.e. a bit error. If so, the cache array redundancy is applied without marking the processor as unavailable. At some time later, the system undergoes a re-initial program load (re-IPL) at which time it is determined whether a second failure of the processor occurs. If a second failure occurs, a determination is made as to whether any status bits are set for arrays other than the cache array that experienced the present failure, if so, the processor is marked unavailable. If not, a determination is made as to whether cache redundancy can be applied to correct the failure. If so, the failure is corrected using the cache redundancy. If not, the processor is marked unavailable.

36 Claims, 6 Drawing Sheets

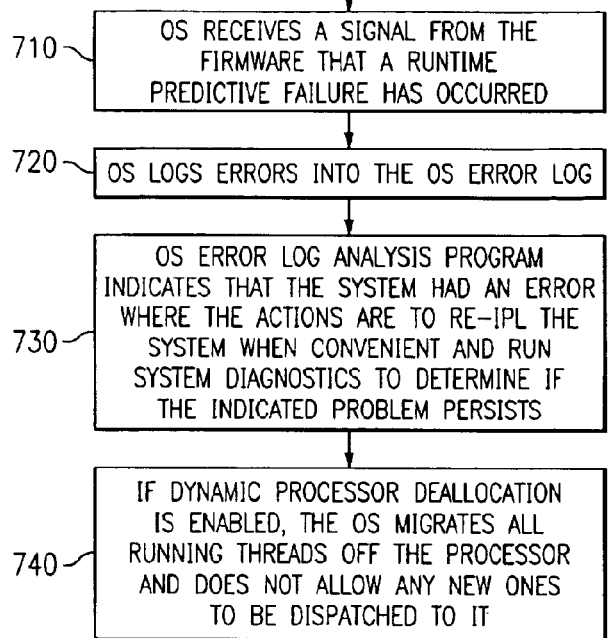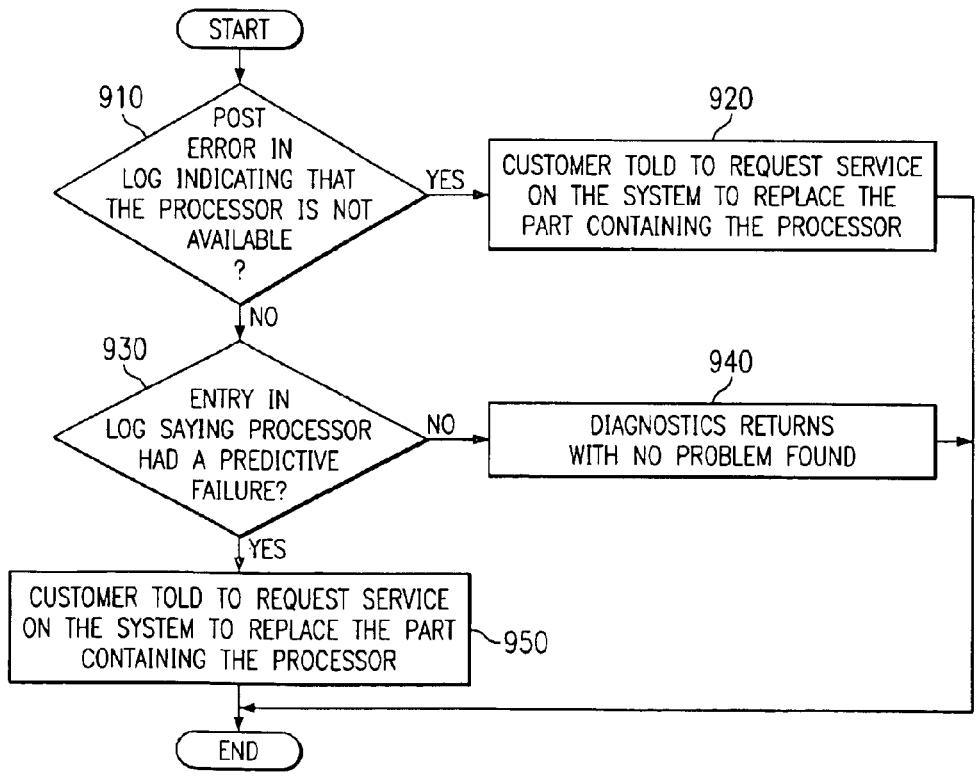

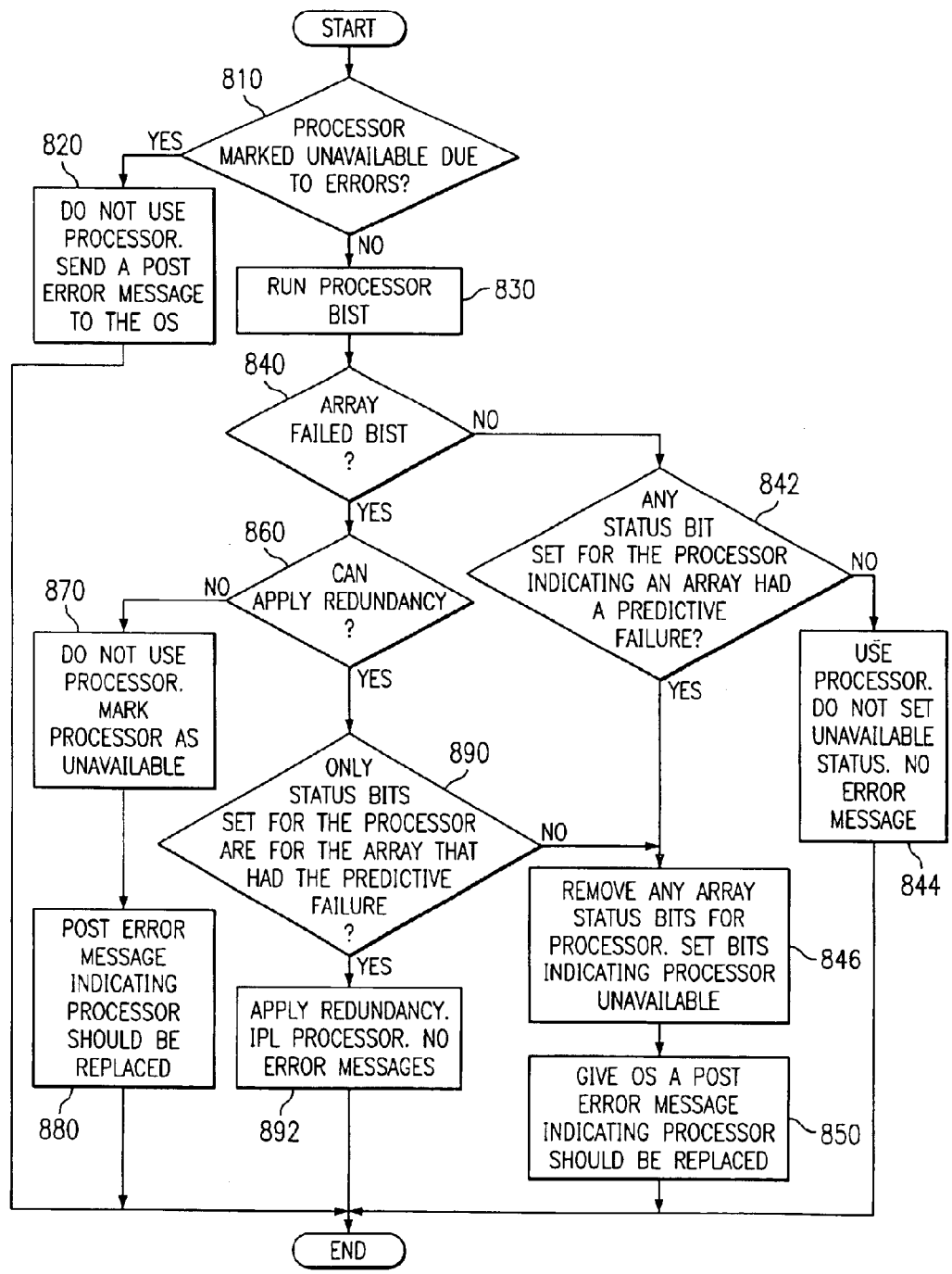

APPARATUS AND METHOD OF REPAIRING A PROCESSOR ARRAY FOR A FAILURE DETECTED AT RUNTIME

BACKGROUND OF THE INVENTION

1. Technical Field

The present invention is directed to an apparatus and method of repairing a processor array for a failure detected at runtime.

2. Description of Related Art

The IBM pSeries computing systems contain several advanced features intended to enhance the availability of systems. One such feature is persistent deallocation of system components, such as processors and memory. Persistent deallocation provides a mechanism for marking system components as unavailable and preventing them from being configured into systems during system boot. The service processor firmware marks the components unavailable if the component failed a test at system boot, had an unrecoverable error during run time, or if the component exceeded a threshold of recoverable errors during run time suggesting that it might be more susceptible to an uncorrectable error later on.

Another such feature of the IBM pSeries computing systems is called dynamic deallocation for system components, such as processors and memory. This feature allows a component to be removed from use during run time should the component exceed a threshold of recoverable errors.

Processors shipped in many of the pSeries systems have internal arrays such as L1 or L2 caches. An advanced feature of these arrays is the incorporation of extra memory capacity that can be configured on a bit by bit basis to replace failed array elements. Configuring this extra memory capacity allows for hardware that can repair around damaged arrays and can continue to function without replacement or degradation.

Originally these spare bits were only used when an error in an array was detected during system boot. This made the extra memory capacity feature useful for repairing processor arrays during the manufacturing process. However, for systems already shipped to the end-user, the function could not be effectively utilized because, in functioning systems, array bits that go bad will tend to be detected during runtime as opposed to at system boot. Because of this, the previously mentioned mechanism of persistent deallocation marks the processor component as bad without ever invoking the mechanism to determine if the array could be repaired.

Thus, it would be beneficial to have an apparatus and method for invoking the mechanism to determine if an array can be repaired and to repair the array if possible, before the processor component is marked as bad by the persistent deallocation mechanism.

SUMMARY OF THE INVENTION

The present invention provides an apparatus and method of repairing a processor array for a failure detected at runtime in a system supporting persistent component deallocation. The apparatus and method of the present invention allow redundant array bits to be used for recoverable faults detected in arrays during run time, instead of only at system boot, while still maintaining the dynamic and persistent processor deallocation features of the computing system.

With the apparatus and method of the present invention, a failure of a cache array is detected and a determination is made as to whether a repairable failure threshold is exceeded during runtime. If this threshold is exceeded, a determination is made as to whether cache array redundancy may be applied to correct the failure, i.e. a bit error. If so, firmware makes note of the failure in persistent storage using status bits which mark what array saw the threshold exceeded.

At some time later, the system undergoes a re-initial program load (re-IPL) at which time it is determined whether an array failure is detected by a self test of arrays associated with the processor. If a failure is detected, a determination is made as to whether any status bits are set for arrays other than the cache array that experienced the present failure, if so, the processor is marked unavailable. If not, a determination is made as to whether cache redundancy can be applied to correct the failure. If so, the failure is corrected using the cache redundancy. If not, the processor is marked unavailable.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 7 is a flowchart outlining runtime operating system behavior according to the present invention;

FIG. 8 is a flowchart of service processor firmware behavior at the next IPL following the detection of an array error during runtime in the present invention;

FIG. 9 is a flowchart outlining the operation of customer run diagnostics according to the present invention.

DETAILED DESCRIPTION OF THE PREFERRED EMBODIMENTS

Figure 1:
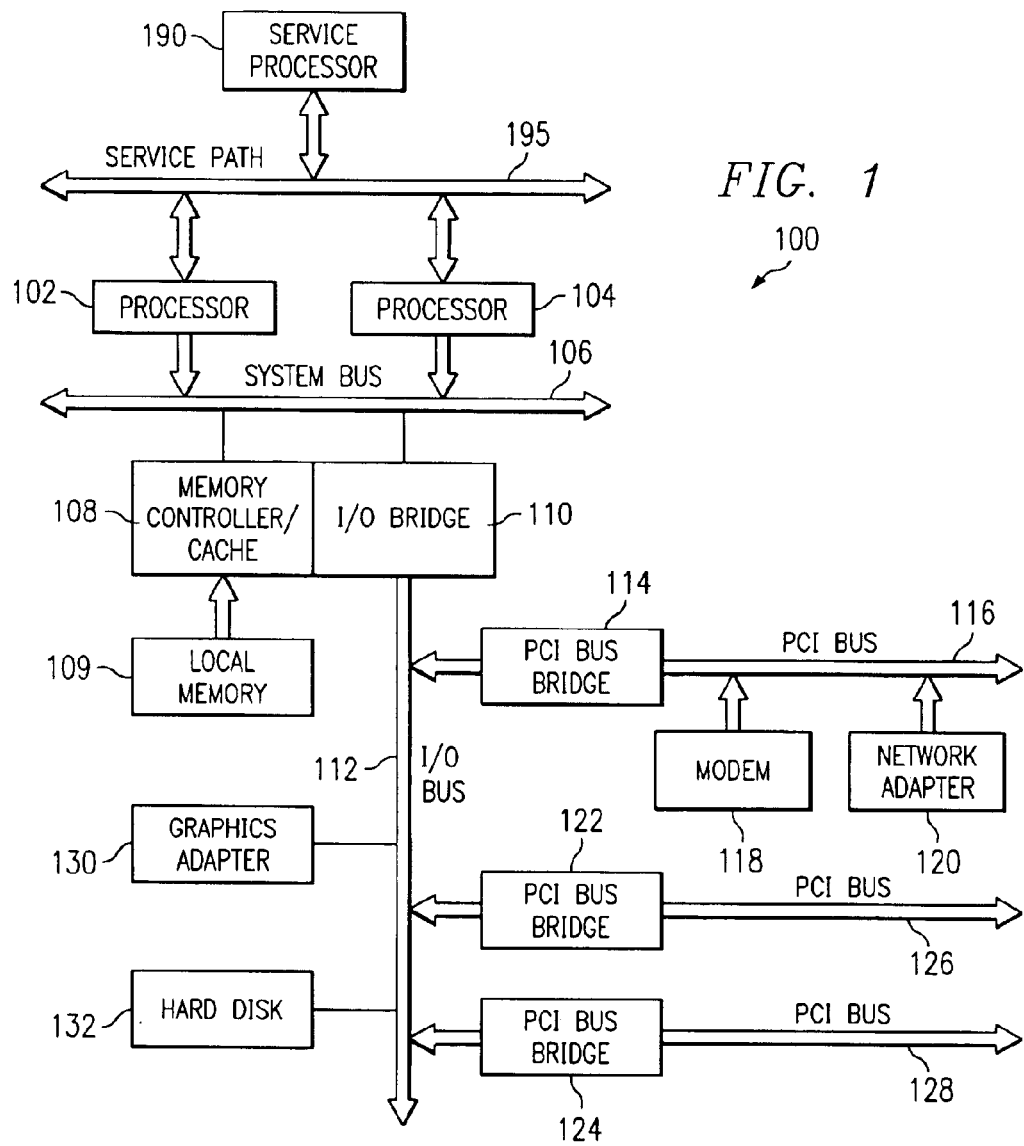
FIG. 1 is a pictorial representation of a data processing system in which the present invention may be implemented.

The present invention provides a mechanism for providing repair of processor arrays at runtime. Before describing the details of the preferred embodiments of the present invention, it is important to have an understanding of the terms used herein. Therefore, the following is a brief description of the terms as they will be used in the following detailed description of the preferred embodiments:

BIST—Built in Self Test

A test of a component performed with the help of self-testing circuitry within a component. Such tests are generally run before the component becomes operational.

ABIST

One such self-test used to determine the function of a component such as the processor and in the case of the processors described in this document, finding solid internal array faults.

POST—Power On Self Test

A test of a component or part of a system generally performed with system power to the component. Depending on design, a BIST could be part of the Power on Self Test of a system.

IPL—Initial Program Load

Generally speaking, the process of taking a system from a powered-off or non-running state to the point of loading operating system specific code. This process would include running through BIST and/or POST tests of various components. In a multi-processor system all functioning processors would go through the IPL process.

IPLed—System went through Process of IPL

Generally speaking that a system or processor was brought up through the IPL process.

Service Processor

A processor that is separate from the processors used to run an operating system in a system. The service processor runs specialized firmware code to run portions of the IPL, generally including BIST. The service processor usually has controlling access to the hardware including the ability to start and stop processors and read fault isoation registers in the various components. The service processor may also be available to help diagnosis system problems that occur during run time.

System Firmware

A layer of firmware that runs on the same processors as the operating system and is used to provide a low level of interface to various hardware components while isolating the operating system from the details of that hardware access. The system firmware may communicate with the Service Processor of the system.

Firmware

In this description, firmware as a general term will be used when a function is described that is performed by one of, or a combination of, system and service processor firmware.

RTAS—Run Time Abstraction Services

The interface protocol between the system firmware and the operating system. RTAS is comprised in part of a set of functions or calls that the operating system can make to the system firmware.

Event-Scan

A particular RTAS call that the operating system makes periodically to the system firmware. In the return from the call, the system firmware passes back any error information it has not yet sent to the operating system. These can be errors detected during the IPL process (called POST errors) or non-fatal errors detected during run time.

POST Error

Any error that occurs during the IPL process. Generally these are communicated by the service processor firmware to the system firmware. The system firmware in turn reports these errors through event-scan to the operating system.

Predictive Failure

Any non-fatal error condition that can be considered predictive of a future fatal failure. An example is a series of correctable memory errors that indicate a single bit of a memory module has failed. This is considered predictive of a possible fatal error since if any random failure occurs on another bit within the same ECC word, the system would suffer an uncorrectable or fatal error.

SRC—Service Request Code

An alphanumeric identifier associated with an error that can be used by a servicer of a system to determine what actions to be taken to correct a problem.

Diagnostics (Diags)

Generally a program for determining if a system has a problem requiring service. For this document diags is a program that uses the operating system to test devices, do an analysis of the error log and to verify and record repairs.

Servicer

Qualified person who diagnoses hardware problems, replaces defective parts and verifies repairs.

Error Log

A history of system error events. For this document the System error log is maintained in the operating system and can be queried from the operating system directly or through the use of diagnostics. Diagnostics have the ability to record in the log when a repair has been made on a device with an error so that future diagnostics error log analysis does not continue to report the error.

Persistent Deallocation

A system feature that marks a component such as a processor as being "unavailable" for use during an IPL. The feature (also known as Repeat Gard) will mark the component bad if the processor fails during the IPL, if a fatal error occurs during run time that is isolated to the component, or if a threshold of non-fatal errors is reached (a predictive failure.)

Dynamic Deallocation

A system feature that migrates all workload of a component such as a processor during run time and prevents any new workload to be added to the component while the system is still operating. This feature of the operating system (also known as CPU Gard for a processor) migrates the workload if a threshold of non-fatal errors is reached (a predictive failure.) Generally this feature must be enabled by a customer if the customer desires it to be active. It is used in conjunction with Persistent Deallocation to ensure that the component is not configured back in to the system on the next IPL.

Thread

A unit of workload for a processor.

AIX

A native operating system for the IBM pSeries systems.

With reference now to the figures, FIG. 1 illustrates a block diagram of a data processing system that may be used to implement the present invention. Data processing system 100 may be a symmetric multiprocessor (SMP) system including a plurality of processors 102 and 104 connected to system bus 106. Alternatively, a single processor system may be employed. Also connected to system bus 106 is memory controller/cache 108, which provides an interface to local memory 109. I/O bus bridge 110 is connected to system bus 106 and provides an interface to I/O bus 112. Memory controller/cache 108 and I/O bus bridge 110 may be integrated as depicted.

Peripheral component interconnect (PCI) bus bridge 114 connected to I/O bus 112 provides an interface to PCI local bus 116. A number of modems may be connected to PCI local bus 116. Typical PCI bus implementations will support four PCI expansion slots or add-in connectors. Communications links to other computing devices may be provided through modem 118 and network adapter 120 connected to PCI local bus 116 through add-in boards.

Additional PCI bus bridges 122 and 124 provide interfaces for additional PCI local buses 126 and 128, from which additional modems or network adapters may be supported. In this manner, data processing system 100 allows connections to multiple network computers. A memory-mapped graphics adapter 130 and hard disk 132 may also be connected to I/O bus 112 as depicted, either directly or indirectly.

In addition to the above, a service processor 190 is provided. The service processor 190 has access to the processors, such as processors 102 and 104, through separate service path 195 for scanning data in and out of processor registers and controlling processor clocks. The service processor actually has access to nearly every element in the system other than power and I/O adapters/devices, but for the purposes of simplicity of the present disclosure the service processor 190 is only shown as having access to the processors is sufficient.

The service processor 190, in a preferred embodiment, performs the functionality of the present invention in repairing arrays in processors, such as processors 102 and 104. The service processor 190, during runtime, determines if a bit in an array of a processor is bad. If a bit is determined to be bad in the array, an attempt is made to repair the array. If the processor array cannot be repaired, or if the repair attempt does not fix the problem, the processor may be taken off-line and a user may be informed of a need to replace the part containing the faulty processor.

Those of ordinary skill in the art will appreciate that the hardware depicted in FIG. 1 may vary. For example, other peripheral devices, such as optical disk drives and the like, also may be used in addition to or in place of the hardware depicted. The depicted example is not meant to imply architectural limitations with respect to the present invention.

The data processing system depicted in FIG. 1 may be, for example, an IBM pSeries system, a product of International Business Machines Corporation in Armonk, N.Y., running the Advanced Interactive Executive (AIX) operating system or LINUX operating system. Alternatively, the data processing system may be any type of data processing system that supports the use of persistent component deallocation.

Figure 2:
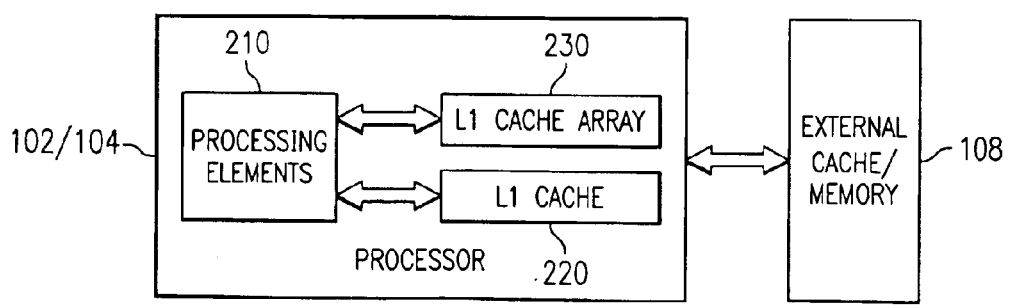
FIG. 2 is an expanded view of the internal components of processors of FIG. 1.

FIG. 2 is an expanded view of the internal components of processors 102 and 104 of FIG. 1. As shown in FIG. 2, the processor 102/104 includes processing elements 210, level 1 (L1) cache 220 and a level 1 cache array 230. An additional level 2 (L2) cache 240 may be provided external to the processor 102/104. The terms "level 1" and "level 2" cache refer to the "closeness" of the cache to the processing elements 210. An L1 cache is a memory cache built into the processor chip or packaged within the same module as the chip. An L2 cache is a memory cache that is external to the processor chip or module.

The present invention provides a mechanism by which array redundancy in the cache array, in the depicted example, L1 cache array 230, may be used to compensate for errors detected during runtime and not only at initial program load, i.e. system boot. In this way, the present invention allows a system to first attempt to compensate for an error by using array redundancy before the processor or other component is marked as unavailable due to errors.

As previously noted, known systems are capable of taking advantage of array redundancy in systems if a failure is detected during initial program load. Such a failure would be, for example, a bit error detected by the processor built-in self test known as ABIST. This self test is run under the control of the service processor firmware during IPL. If a bit error is detected and a spare is available, the spare bit is used in place of the faulty one as part of the process.

Figure 3:
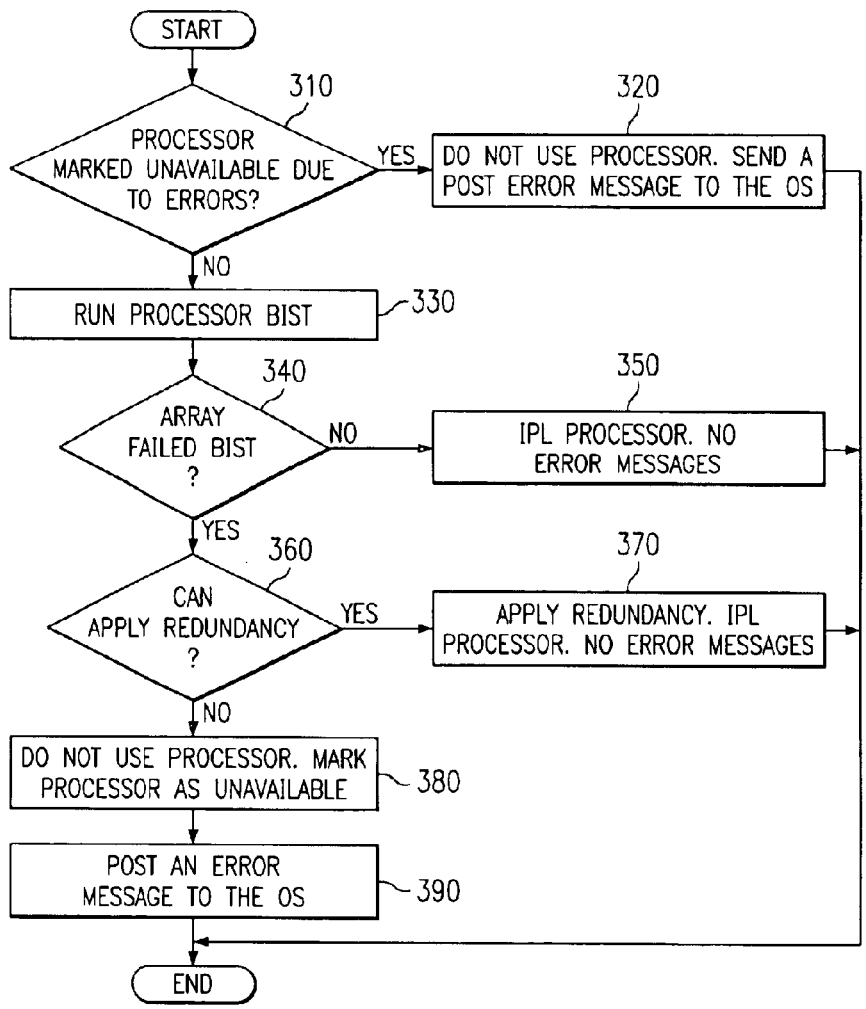
FIG. 3 illustrates the operation of a known system for compensating for a detected failure using array redundancy at IPL.

FIG. 3 illustrates the operation of a known system for compensating for a detected failure using array redundancy at IPL. As shown in FIG. 3, the operation starts with a determination by the service processor firmware as to whether the processor is marked unavailable due to errors (step 310). If the processor is marked as unavailable due to errors, the service processor will insure that the processor is not used and will create a POST error message for the operating system (step 320).

If the processor is not marked as unavailable due to errors, the service processor initiates a built-in self test of the processor (step 330). As part of the process, a determination is made as to whether the array failed the built-in self test (step 340). If not, the service processor firmware allows the initial program load of the processor and no error messages are sent (step 350). If the array failed the BIST, a determination is made as to whether redundancy may be applied to compensate for the failure (step 360).

If redundancy can be applied, it is applied and the initial program load is run on the processor with no error messages generated (step 370). If redundancy cannot be applied, the service processor firmware marks the processor as unavailable and the processor is not used (step 380). The service processor firmware creates an error message for the operating system (step 390) and the operation ends.

As previously mentioned, the operation shown in FIG. 3 is at IPL time. Currently, the known systems cannot take advantage of redundancy if the array error is detected during normal system operation, i.e. at runtime. This is due to the persistent deallocation feature of the firmware. This persistent deallocation feature detects that the array is bad, and prevents the BIST from being run against the array to the next IPL. That is, in FIG. 3, the result of step 310 will be "Yes" and the processor will not be used.

Figure 4:
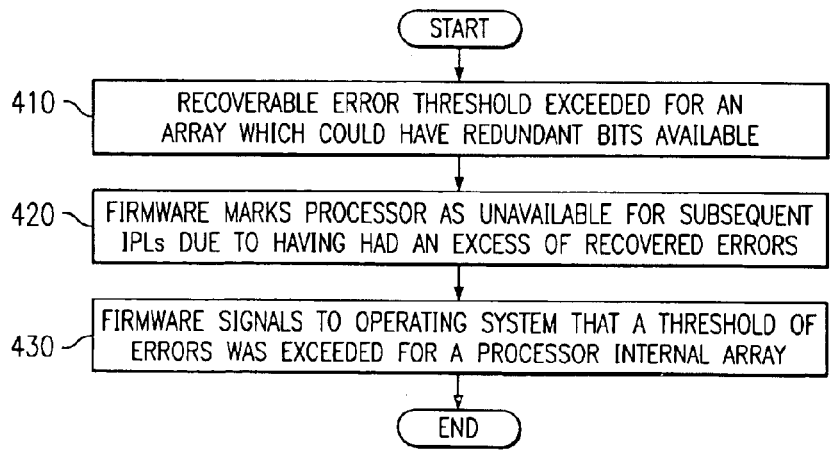
FIG. 4 illustrates the runtime behavior of a known system and explains why the persistent deallocation feature causes the system to not be able to take advantage of array redundancy.

FIG. 4 illustrates the runtime behavior of a known system and explains why the persistent deallocation feature causes the system to not be able to take advantage of array redundancy. As shown in FIG. 4, at runtime a recoverable error threshold is exceeded for an array which could have redundant bits available (step 410). The firmware marks the processor as unavailable for subsequent IPLs due to having had an excess of recovered errors (step 420). The firmware signals to the operating system that a threshold of errors was exceeded for a processor internal array (step 430) and the operation ends. The key problem with this operation is that the persistent processor deallocation function prevents the processor from being considered for use in subsequent IPLs even if the array problem could be corrected at IPL.

Figure 5:
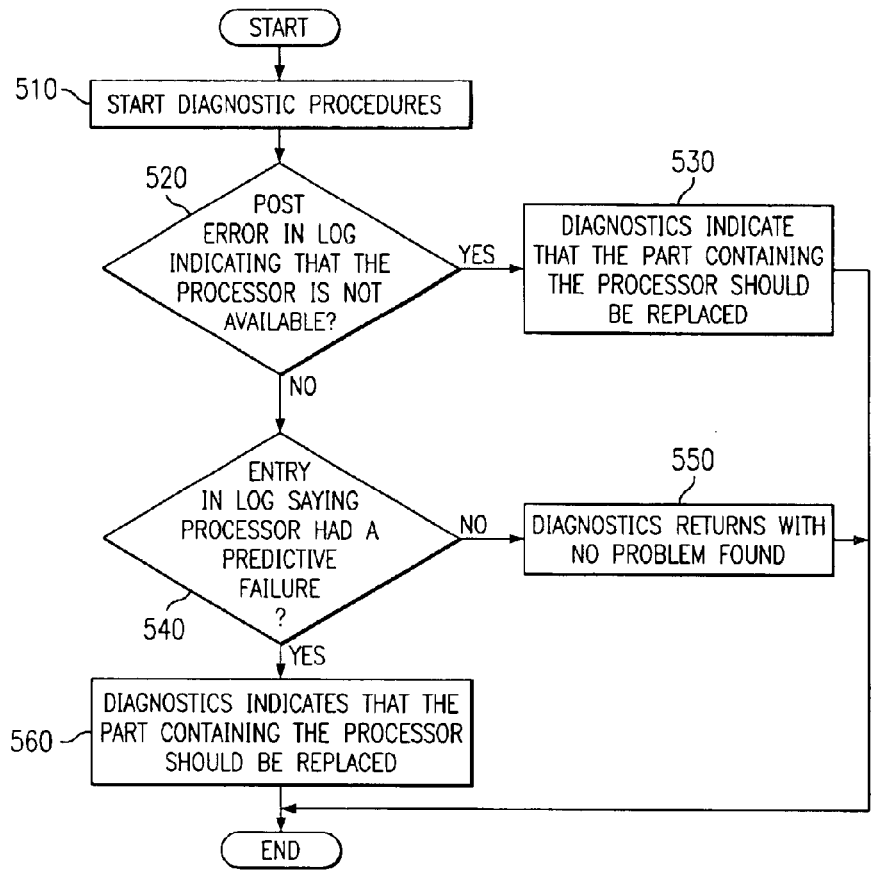
FIG. 5 illustrates the operation of a known system during running of diagnostic procedures.

From a diagnostics standpoint, if the array failure were detected at runtime, the processor would always be called out for replacement. FIG. 5 illustrates the operation of a known system during running of diagnostic procedures. As shown in FIG. 5, the operation starts with the start of diagnostic procedures (step 510). A decision is made whether or not to log a POST error indicating the processor is not available (step 520). If a POST error is to be logged, the diagnostics indicate that the part containing the processor should be replaced (step 530). Taking this path is indicative that the system had been IPLed since the error was discovered.

If a POST error is not logged, a determination is made whether to log an entry indicating that the processor had a predictive failure (step 540). If not, the diagnostics return with no problems reported (step 550). If a predictive failure log entry is to be entered, the diagnostics indicate that the part containing the processor should be replaced (step 560). Taking this path is indicative that the system had not been IPLed since the error was discovered. The diagnostics operation then ends. Thus, if a failure occurs, the diagnostics will always indicate that the part containing the processor needs to be replaced.

Figure 6:
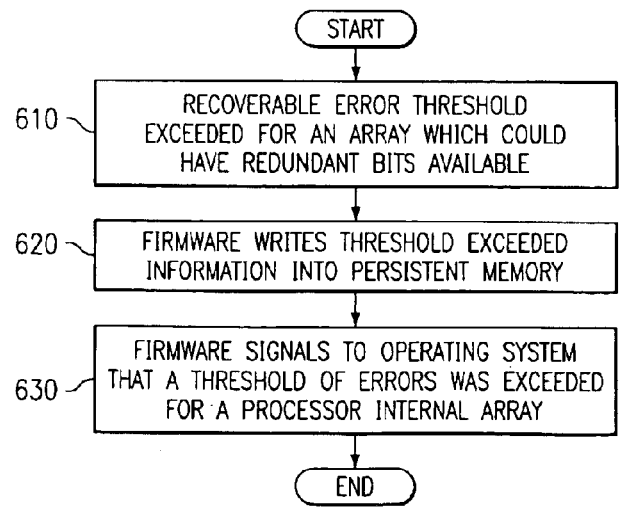
FIG. 6 is a flowchart outlining an exemplary operation of the present invention at runtime where a single bit error exceeds a threshold.

FIG. 6 is a flowchart outlining an exemplary operation of the present invention at runtime where a single bit error exceeds a threshold. A shown in FIG. 6, the operation starts with a recoverable error threshold exceeded for an array which could have redundant bits available (step 610). The firmware writes threshold exceeded information into persistent memory but does not mark the processor as unavailable (step 620).

In step 620, a predictive failure error log entry is presented by event scan to the operating system. The processor is marked by, for example, a service processor, as "predictive failure experienced" with a code indicating that the processor had an array soft error threshold exceeded problem. The code may distinguish which array had the problem. This marking may, in effect, be additional information stored in the same manner as the persistent deallocation information is stored in the known systems.

The firmware then signals to the operating system that a threshold of errors was exceeded for a processor internal array (step 630) and the operation ends.

FIG. 7 is a flowchart outlining runtime operating system behavior according to the present invention. As shown in FIG. 7, the operation starts with the operating system receiving a signal from the firmware that a runtime predictive failure has occurred (step 710). This may be done using an RTAS event_scan call.

The operating system logs errors into the operating system error log (step 720). The operating system error log analysis program indicates that the system had an error where the actions are to re-IPL the system when convenient and run system diagnostics to determine if the indicated problem persists (step 730). If dynamic processor deallocation is enabled, the operating system migrates all running threads off the processor and does not allow any new ones to be dispatched to the processor (step 740).

As can be seen from FIG. 7, a predictive failure will result in dynamic deallocation being invoked for the processor according to a set policy. The policy may be set by the user, for example. With known systems, this would be considered a permanent error and a human servicer would be dispatched to replace the failed processor.

With the present invention, however, the particular error may be repairable by the hardware without the need for replacement. With the present invention, when a repairable error is identified, the following actions show the steps that would normally be performed presuming an AIX operating system. Other operating systems could provide equivalent functionality:

1) when the predictive failure occurs, an entry in the AIX error log will be made indicating that there was a failure. There are mechanisms within the operating system that can be used to either automatically, or on customer request, do analysis of the error log entry. This analysis will indicate a potential problem with the processor that requires the attention of a servicer;

2) when called to repair the system, the servicer will be directed by a maintenance package for the system to run AIX diagnostic repair verification against the processor as if a fix had been made for the processor;

3) the servicer will shutdown and re-IPL the system;

4) the servicer will then run AIX Problem determination diagnostics;

5) if the processor is called out by the diagnostics, the servicer will replace the processor; and 6) if the processor is not called out by the diagnostics, then the system has repaired the error without need for a processor replacement.

The above does require that the service processor continue to create a POST error log entry on each IPL where a processor is persistently deallocated due to an error.

At first IPL of the system after the predictive failure, the service processor firmware will either fix the array that had previously been detected as having a predictive failure or else identify the processor with the predictive failure as being bad and in need of repair. Fixing the array presumes that there is redundancy available to be applied. It also requires that the array failure was such that there is now a bit problem that was solid enough to be detected by the BIST at IPL. This scenario supposes cases where the problem was very intermittent in nature when the system was first IPLed and that over the course of time the problem grew solid and has hence, been detected as a predictive failure by exceeding a threshold of recoverable errors. This is consistent with how most such errors are expected to be detected in operational systems.

FIG. 8 is a flowchart of service processor firmware behavior at the next IPL following the detection of an array error during runtime. As shown in FIG. 8, the operation starts with a determination whether the processor is marked unavailable (step 810). If the processor is marked as unavailable due to errors, the processor is not used and a POST error message is sent to the operating system (step 820).

If the processor is not marked as unavailable due to errors, a built-in self test is run on the processor (step 830). A determination is made as to whether the array failed the built-in self test (step 840). If not, a determination is made as to whether there are status bits set indicating that an array had a predictive failure during runtime (step 842). If not, the processor may be used, an unavailable status is not set, and no error messages are sent (step 844). If there are status bits indicating that an array had a predictive failure during runtime, any array status bits for the processor are removed and bits are set indicating that the processor is unavailable (step 846). The processor is not used and the operating system is given a POST error message indicating that the processor should be replaced (step 850).

If the array failed the BIST, a determination is made as to whether redundancy may be applied to compensate for the failure (step 860). If redundancy cannot be applied, any array status bits for that processor are removed and bits are set indicating that the processor is unavailable (step 870). The processor is not IPLed and the operating system is given a POST error message indicating that the processor should be replaced (step 880).

If redundancy can be applied, a determination is made as to whether status bits that are set for the processor are only those status bits associated with the array that had a predictive failure during run-time (step 890). If so, redundancy is applied and any array status bits are removed (step 892). The processor may then be used with no error messages generated (step 894).

If there are other status bits set for other arrays associated with the processor, any array status bits for the processor are removed and bits indicating that the processor is unavailable are set (step 896). The processor is not IPLed and the operating system is given a POST error message indicating that the processor should be replaced.

Essentially what is shown in FIG. 8 is that, when it is determined that an array has an error that exceeds the threshold of recoverable errors, it is not known which particular bit is bad. However, it is known which array had a bad bit.

Thus, when the BIST is run to check for array problems, potentially, an array may be found with a problem other than the one that is being looked for in the first place. In that case, it is presumed that the failure on the array being looked for in the first place, has been missed. This means that it cannot be presumed that the original failure has been fixed. Therefore the part containing the processor needs to be replaced.

FIG. 9 is a flowchart outlining the operation of customer run diagnostics. As shown in FIG. 9, the operation starts with a determination as to whether a POST error in the log indicates that the processor is not available (step 910). If so, the customer is instructed to request service on the system to replace the part containing the processor (step 920). This step represents the case of having an array failure and running diagnostics after the system rebooted and the service processor determined that the processor needed to be replaced. If not, a determination is made as to whether there is an entry in the log that indicates the processor had a predictive failure (step 930).

If not, the diagnostics returns with no problem found (step 940). If the processor did have a predictive failure, the customer is instructed to request service where the servicer will re-IPL the system to determine whether a part needs to be replaced (step 950). This step represents the case of running diagnostics after an array predictive failure but before any system reboot.

Figure 10:
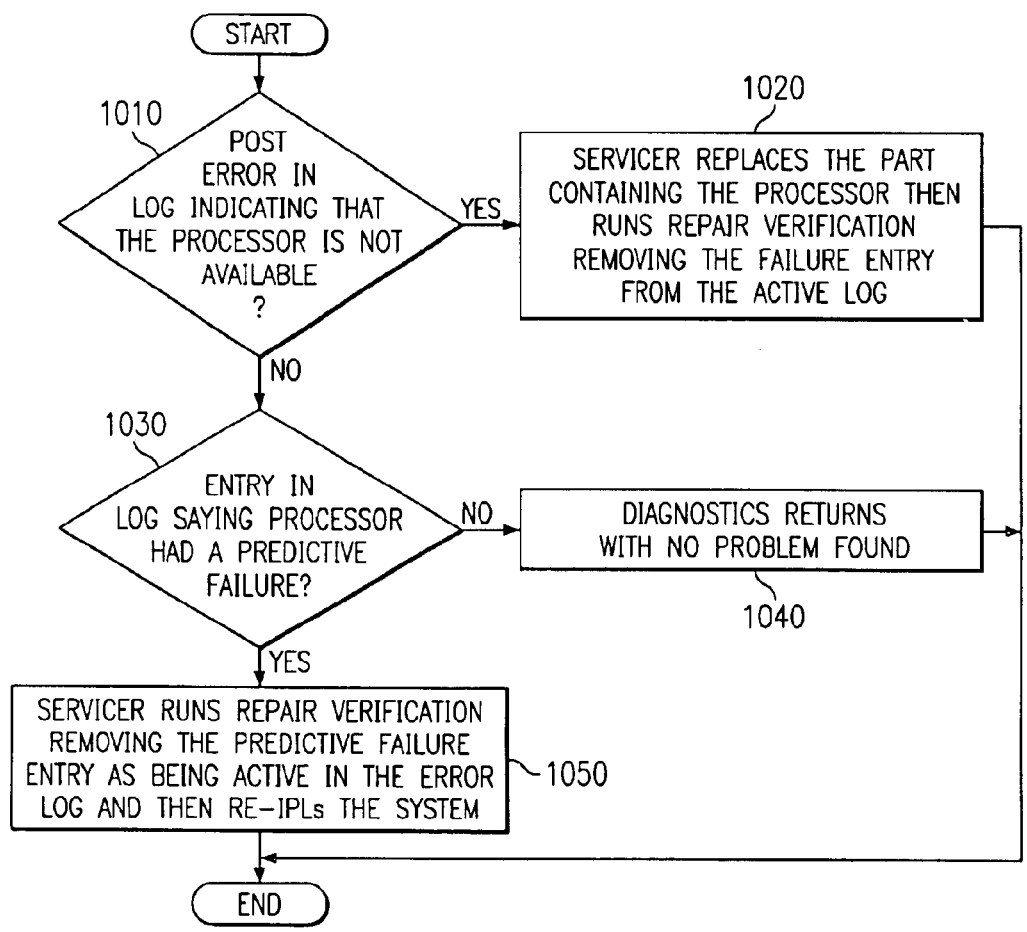
FIG. 10 is a flowchart outlining an exemplary operation of a servicer diagnostic procedure according to the present invention.

FIG. 10 is a flowchart outlining an exemplary operation of a servicer diagnostic procedure performed in response to step 950 in FIG. 9. As shown in FIG. 10, the operation starts with a determination as to whether there is a POST error in the log indicating that the processor is not available (step 1010). If so, the servicer replaces the part containing the processor and then runs repair verification to remove the failure entry from the active log (step 1020). This represents the case of running the diagnostics after the system had been re-IPLed after an array failure and the service processor on the re-IPL determining that the processor needed to be replaced.

If not, a determination is made as to whether an entry in the log indicates that the processor had a predictive failure (step 1030). If not, the diagnostic returns with no problem found (step 1040). If so, the servicer runs repair verification procedures that eliminate the predictive failure entry as being active in the error log (step 1050). The servicer may then re-IPL the system.

After re-IPL, the servicer will then begin the process outlined in FIG. 10 again. If the array could not be repaired by the service processor after IPL, then step 1010 would be true as there would be a POST error log entry. This would lead to step 1020 and the part containing the processor being replaced.

If the array was repaired, then there would be no POST error log entry and step 1010 would lead to step 1030. At this step it would be determined that there was no active predictive failure error log entry (having effectively been removed previously by step 1050). Thus step 1040 would be executed indicating that the system was now fully repaired.

The previous description for the process in FIG. 10 presumes that the system was not re-IPLed before the servicer began working on it. The same process still results in the desired behavior if the customer had done a re-IPL. If a previous IPL had occurred, step 1010 concerning the existence of a POST error log entry will be answered affirmatively if, on the previous IPL, the array could not be repaired. This will lead to step 1020 and replacement of the processor. If the array had been repaired, then step 1010 would be answered negatively, leading to step 1030. Since there will be a log entry indicating that the processor had a failure, step 1050 would be performed next. In this step, the servicer will remove the predictive failure entry.

The servicer at this point may use information in the system error log to realize that the system had previously been rebooted and the array repaired. The service action would then be complete. FIG. 10 does not require this, however, and shows that from step 1050, the servicer would IPL the system again and follow the same procedure outlined in FIG. 10. This time, step 1010 would be answered no and step 1030 would be answered no, thereby ending the procedure at step 1040.

Thus, the present invention provides an apparatus and method by which a processor array may be repaired during the next IPL after an array is determined to be faulty due to an exceeded threshold of recoverable errors while maintaining the ability to persistently deconfigure the processor when repair is not possible.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of correcting an error in a processor of a computing system, comprising:

identifying a failure of a cache array of a processor;

deferring deallocation of the processor until reboot of the computing system;

determining, at reboot of the computing system, if redundancy in the cache array may be used to correct the failure of the cache array; and deallocating the processor, at reboot of the computing system, if it is determined that redundancy in the cache array cannot be used to correct the failure of the cache array.

2. The method of claim 1, further comprising applying redundancy in the cache array to correct the failure, at reboot of the computing system, if redundancy in the cache array may be used.

3. The method of claim 2, further comprising:
performing an initial program load after one of applying redundancy in the cache array and deallocating the processor.

4. The method of claim 1, wherein identifying a failure of a cache array of a processor includes determining if a recoverable error threshold is exceeded for the cache array.

5. The method of claim 4, further comprising:
writing threshold exceeded information into persistent memory, wherein deferring deallocation of the processor includes inhibiting marking the processor as unavailable.

6. The method of claim 1, wherein deallocating the processor, at reboot of the computing system, includes:
marking the processor as unavailable if redundancy cannot be used to correct the failure of the cache array.

7. The method of claim 6, further comprising:
determining if a second failure of the cache array occurs at reboot of the computing system;
determining if cache array redundancy may be applied to correct the second failure; and
applying cache array redundancy if cache array redundancy may be applied to correct the second failure.

8. The method of claim 7, further comprising:
removing cache array status bits and setting one or more bits indicating the processor to be unavailable, if cache array redundancy cannot be applied to correct the second failure.

9. The method of claim 7, wherein applying cache array redundancy includes:
determining if status bits that are set for the processor are only status bits associated with the cache array; and
removing status bits for the processor and setting bits indicating that the processor is unavailable, if status bits set for the processor include status bits other than those associated with the cache array.

10. The method of claim 9, further comprising:
removing the status bits and setting one or more bits indicating that the processor is unavailable, if there are status bits indicating that the cache array had a predictive failure during runtime.

11. The method of claim 6, further comprising:
determining if another failure of the cache array occurs at reboot of the computing system; and
determining if there are status bits set indicating that the cache array had a predictive failure during runtime, if another failure did not occur.

12. The method of claim 1, wherein deallocating the processor includes setting one or more bits indicating the processor is unavailable.

13. An apparatus for correcting an error in a processor of a computing system, comprising:
means for identifying a failure of a cache array of a processor;
means for deferring deallocation of the processor until reboot of the computing system;
means for determining, at reboot of the computing system, if redundancy in the cache array may be used to correct the failure of the cache array; and
means for deallocating the processor, at reboot of the computing system, if it is determined that redundancy in the cache array cannot be used to correct the failure of the cache array.

14. The apparatus of claim 13, further comprising means for applying redundancy in the cache array to correct the failure, at reboot of the computing system, if redundancy in the cache array may be used.

15. The apparatus of claim 14, further comprising:
means for performing an initial program load after one of applying redundancy in the cache array and deallocating the processor.

16. The apparatus of claim 13, wherein the means for identifying a failure of a cache array of a processor includes means for determining if a recoverable error threshold is exceeded for the cache array.

17. The apparatus of claim 16, further comprising:
means for writing threshold exceeded information into persistent memory, wherein the means for deferring deallocation of the processor includes means for inhibiting marking the processor as unavailable.

18. The apparatus of claim 13, wherein the means for deallocating the processor, at reboot of the computing system, includes:
means for marking the processor as unavailable if redundancy cannot be used to correct the failure of the cache array.

19. The apparatus of claim 18, further comprising:
means for determining if a second failure of the cache array occurs at reboot of the computing system;
means for determining if cache array redundancy may be applied to correct the second failure; and
means for applying cache array redundancy if cache array redundancy may be applied to correct the second failure.

20. The apparatus of claim 19, further comprising:
means for removing cache array status bits and setting one or more bits indicating the processor to be unavailable, if cache array redundancy cannot be applied to correct the second failure.

21. The apparatus of claim 19, wherein the means for applying cache array redundancy includes:
means for determining if status bits that are set for the processor are only status bits associated with the cache array; and
means for removing status bits for the processor and setting bits indicating that the processor is unavailable, if status bits set for the processor include status bits other than those associated with the cache array.

22. The apparatus of claim 21, further comprising:
means for removing the status bits and setting one or more bits indicating that the processor is unavailable, if there are status bits indicating that the cache array had a predictive failure during runtime.

23. The apparatus of claim 18, further comprising:
means for determining if another failure of the cache array occurs at reboot of the computing system; and
means for determining if there are status bits set indicating that the cache array had a predictive failure during runtime, if another failure did not occur.

24. The apparatus of claim 13, wherein the means for deallocating the processor includes means for setting one or more bits indicating the processor is unavailable.

25. A computer program product in a computer readable medium for correcting an error in a processor of a computing system, comprising:
first instructions for identifying a failure of a cache array of a processor;
second instructions for deferring deallocation of the processor until reboot of the computing system;
third instructions for determining, at reboot of the computing system, if redundancy in the cache array may be used to correct the failure of the cache array; and fourth instructions for deallocating the processor, at reboot of the computing system, if it is determined that redundancy in the cache array cannot be used to correct the failure of the cache array.

26. The computer program product of claim 25, further comprising fifth instructions for applying redundancy in the cache array to correct the failure, at reboot of the computing system, if redundancy in the cache array may be used.

27. The computer program product of claim 26, further comprising:

sixth instructions for performing an initial program load after one of applying redundancy in the cache array and deallocating the processor.

28. The computer program product of claim 25, wherein the first instructions for identifying a failure of a cache array of a processor include instructions for determining if a recoverable error threshold is exceeded for the cache array.

29. The computer program product of claim 28, further comprising:

fifth instructions for writing threshold exceeded information into persistent memory, wherein the second instructions for deferring deallocation of the processor include instructions for inhibiting marking the processor as unavailable.

30. The computer program product of claim 25, wherein the fourth instructions for deallocating the processor, at reboot of the computing system, include:

instructions for marking the processor as unavailable if redundancy cannot be used to correct the failure of the cache array.

31. The computer program product of claim 30, further comprising:

fifth instructions for determining if a second failure of the cache array occurs at reboot of the computing system;

sixth instructions for determining if cache array redundancy may be applied to correct the second failure; and seventh instructions for applying cache array redundancy if cache array redundancy may be applied to correct the second failure.

32. The computer program product of claim 31, further comprising:

eighth instructions for removing cache array status bits and setting one or more bits indicating the processor to be unavailable, if cache array redundancy cannot be applied to correct the second failure.

33. The computer program product of claim 31, wherein the seventh instructions for applying cache array redundancy include:

instructions for determining if status bits that are set for the processor are only status bits associated with the cache array; and instructions for removing status bits for the processor and setting bits indicating that the processor is unavailable, if status bits set for the processor include status bits other than those associated with the cache array.

34. The computer program product of claim 33, further comprising:

instructions for removing the status bits and setting one or more bits indicating that the processor is unavailable, if there are status bits indicating that the cache array had a predictive failure during runtime.

35. The computer program product of claim 30, further comprising:

fifth instructions for determining if another failure of the cache array occurs at reboot of the computing system; and Sixth instructions for determining if there are status bits set indicating that the cache array had a predictive failure during runtime, if another failure did not occur.

36. The computer program product of claim 25, wherein the fourth instructions for deallocating the processor include instructions for setting one or more bits indicating the processor is unavailable.

* * * * *